United States Patent
Secareanu et al.

(10) Patent No.: US 9,048,110 B2
(45) Date of Patent: Jun. 2, 2015

(54) NOISE ISOLATION BETWEEN CIRCUIT BLOCKS IN AN INTEGRATED CIRCUIT CHIP

(71) Applicants: Radu M. Secareanu, Phoenix, AZ (US); Suman K. Banerjee, Tucson, AZ (US); Olin L. Hartin, Phoenix, AZ (US)

(72) Inventors: Radu M. Secareanu, Phoenix, AZ (US); Suman K. Banerjee, Tucson, AZ (US); Olin L. Hartin, Phoenix, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 88 days.

(21) Appl. No.: 13/802,006

(22) Filed: Mar. 13, 2013

(65) Prior Publication Data
US 2013/0207229 A1 Aug. 15, 2013

Related U.S. Application Data

(62) Division of application No. 12/512,616, filed on Jul. 30, 2009, now abandoned, which is a division of application No. 11/360,285, filed on Feb. 23, 2006, now Pat. No. 7,608,913.

(51) Int. Cl.
| | |
|---|---|
| H01L 29/00 | (2006.01) |
| H01L 23/552 | (2006.01) |
| H01L 29/06 | (2006.01) |
| H01L 21/761 | (2006.01) |
| H01L 21/762 | (2006.01) |
| H01L 21/765 | (2006.01) |
| H01L 21/8234 | (2006.01) |

(52) U.S. Cl.
CPC .......... H01L 29/0649 (2013.01); H01L 21/761 (2013.01); H01L 21/762 (2013.01); H01L 21/765 (2013.01); *H01L 21/823481* (2013.01); *H01L 29/0619* (2013.01)

(58) Field of Classification Search
CPC .............. H01L 21/761; H01L 29/0619; H01L 29/0649; H01L 29/1083
USPC ......... 257/544, 549, 550, 547, 507, 509, 504, 257/665, 659, 409, 500, E21.544, 506
See application file for complete search history.

(56) References Cited

U.S. PATENT DOCUMENTS

| | | | |
|---|---|---|---|
| 4,853,759 | A | 8/1989 | Haque |
| 5,196,920 | A | 3/1993 | Kumamoto et al. |

(Continued)

FOREIGN PATENT DOCUMENTS

| | | | |
|---|---|---|---|
| JP | 57072376 A | 5/1982 | |
| JP | 61214550 A | 9/1986 | |

(Continued)

OTHER PUBLICATIONS

International Search Report and Written Opinion for PCT Application No. PCT/US07/60655 mailed Nov. 21, 2008.

(Continued)

*Primary Examiner* — Shouxiang Hu
(74) *Attorney, Agent, or Firm* — Ingrassia Fisher & Lorenz, P.C.

(57) ABSTRACT

An integrated circuit includes a p-well block region having a low doping concentration formed in a region of a substrate for providing noise isolation between a first circuit block and a second circuit block. The integrated circuit further includes a guard region and a grounded, highly doped region for providing additional noise isolation.

20 Claims, 5 Drawing Sheets

(56) References Cited

U.S. PATENT DOCUMENTS

| | | | |
|---|---|---|---|
| 5,475,255 | A | 12/1995 | Joardar et al. |
| 5,623,159 | A * | 4/1997 | Monk et al. ............... 257/509 |
| 6,057,588 | A | 5/2000 | Yamazaki |
| 6,424,022 | B1 | 7/2002 | Wu et al. |
| 6,479,869 | B1 | 11/2002 | Hiraga |
| 6,555,884 | B1 | 4/2003 | Murakami |
| 6,563,181 | B1 | 5/2003 | Du et al. |
| 6,737,713 | B2 | 5/2004 | Georgescu et al. |
| 6,747,294 | B1 * | 6/2004 | Gupta et al. ............... 257/127 |
| 7,071,530 | B1 | 7/2006 | Ding et al. |
| 7,541,652 | B1 | 6/2009 | Abughazaleh |
| 2001/0038138 | A1 * | 11/2001 | Miles et al. ............... 257/544 |
| 2004/0061183 | A1 | 4/2004 | Johnson et al. |
| 2004/0099878 | A1 | 5/2004 | Huang et al. |
| 2004/0099906 | A1 | 5/2004 | Ji et al. |
| 2004/0114287 | A1 | 6/2004 | Salling et al. |
| 2004/0142528 | A1 | 7/2004 | Bhattacharyya |
| 2006/0060934 | A1 | 3/2006 | Lien et al. |

FOREIGN PATENT DOCUMENTS

| | | |
|---|---|---|
| JP | 2166761 A | 6/1990 |
| JP | 06163823 | 6/1994 |
| JP | 2002353320 | 12/2002 |
| JP | 2005038962 | 2/2005 |
| WO | 03/041161 A2 | 5/2003 |
| WO | 2004049444 A1 | 6/2004 |
| WO | 2005/098937 A1 | 10/2005 |

OTHER PUBLICATIONS

EP Application No. 07756373.2 International Search Report and Written Opinion mailed Jun. 25, 2012.

European Patent Office, Office Action for EP Application No. 07756373.2 mailed Jul. 24, 2013.

* cited by examiner

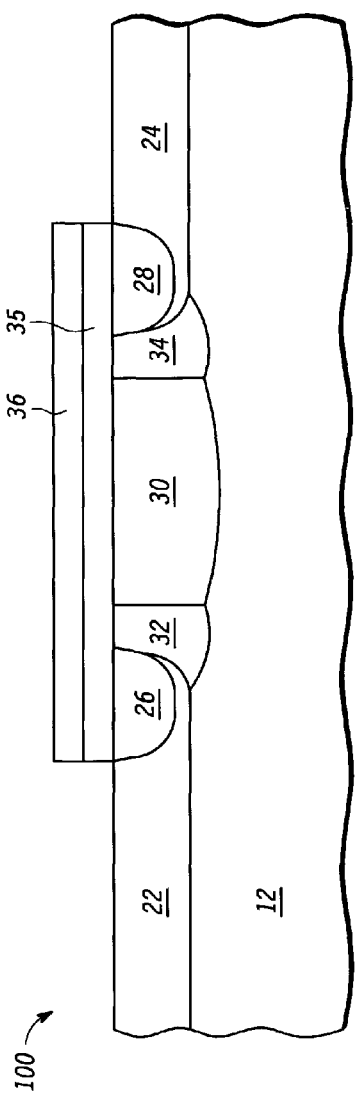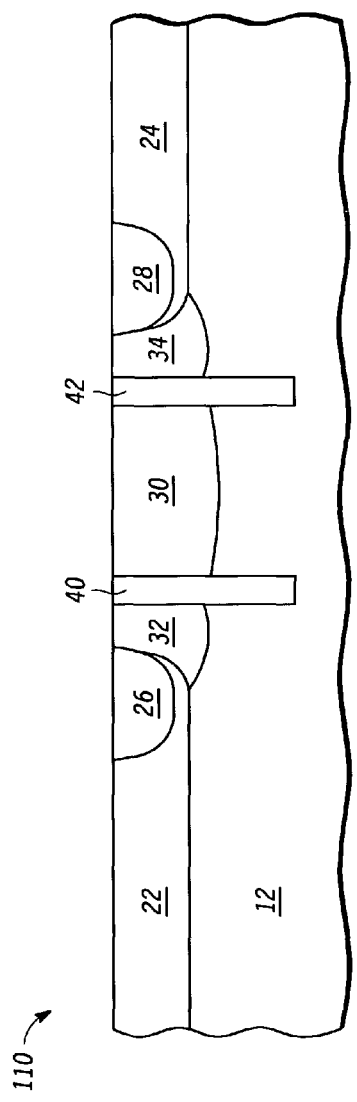

NOISE ISOLATION BETWEEN CIRCUIT BLOCKS IN AN INTEGRATED CIRCUIT CHIP

CROSS-REFERENCE TO RELATED APPLICATIONS

This application claims priority to co-pending U.S. patent application Ser. No. 12/512,616, filed with the USPTO on Jul. 30, 2009, which is a divisional of U.S. patent application Ser. No. 11/360,285, filed with the USPTO on Feb. 23, 2006, and issued Oct. 27, 2009, as U.S. Pat. No. 7,608,913.

TECHNICAL FIELD

Embodiments relate in general to integrated circuits and, more specifically, to noise isolation between circuit blocks in an integrated circuit chip.

BACKGROUND

Increasingly, integrated circuit chips have different types of circuit blocks, such as analog and digital circuit blocks. Without proper noise isolation, noise generated by digital circuit blocks can interfere with more sensitive circuit blocks, such as phase locked loops and low noise amplifier circuits. Conventional noise isolation between different types of circuit blocks requires bias. Bias, however, is prone to contamination and thus compromises noise isolation efficiency.

Thus, there is a need for improved noise isolation between circuit blocks in an integrated circuit chip.

BRIEF DESCRIPTION OF THE DRAWINGS

Embodiments of the inventive subject matter may be better understood, and its numerous objects, features, and advantages made apparent to those skilled in the art by referencing the accompanying drawings.

FIG. 5 is a partial side view of an embodiment of an integrated circuit during a processing stage;

FIG. 6 is a partial side view of an embodiment of an integrated circuit during a processing stage.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments.

DETAILED DESCRIPTION

The following sets forth a detailed description of a mode for carrying out the embodiments of the inventive subject matter. The description is intended to be illustrative of the embodiments and should not be taken to be limiting.

In one aspect, an integrated circuit, including a p-well block region having a high resistivity due to low doping concentration formed in a region of a substrate for providing noise isolation between a first circuit block and a second circuit block, is provided. The integrated circuit further includes a guard region for providing noise isolation between the first circuit block and the second circuit block.

In another aspect, an integrated circuit, including a p-well block region formed in a substrate by blocking insertion of any dopants in a region of the substrate for providing noise isolation between a first circuit block and a second circuit block, is provided. The integrated circuit further includes a guard region for providing noise isolation between the first circuit block and the second circuit block. The integrated circuit further includes a first grounded highly doped region formed between the guard region and the first circuit block and a second grounded highly doped region formed between the guard region and the second circuit block. The integrated circuit further includes a grounded conductive shield formed over a dielectric layer formed at least over the p-well block region and the guard region.

In yet another aspect, an integrated circuit including a p-well block region formed in a substrate by blocking insertion of any dopants in a region of the substrate for providing noise isolation between a first circuit block and a second circuit block, is provided. The integrated circuit further includes a guard region for providing noise isolation between the first circuit block and the second circuit block. The integrated circuit further includes a first grounded highly doped region formed between the guard region and the first circuit block and a second grounded highly doped region formed between the guard region and the second circuit block. The integrated circuit further includes a grounded conductive shield formed over a dielectric layer formed at least over the p-well block region and the guard region. The integrated circuit further includes a trench formed between the p-well block region and the guard region.

Figure 1:
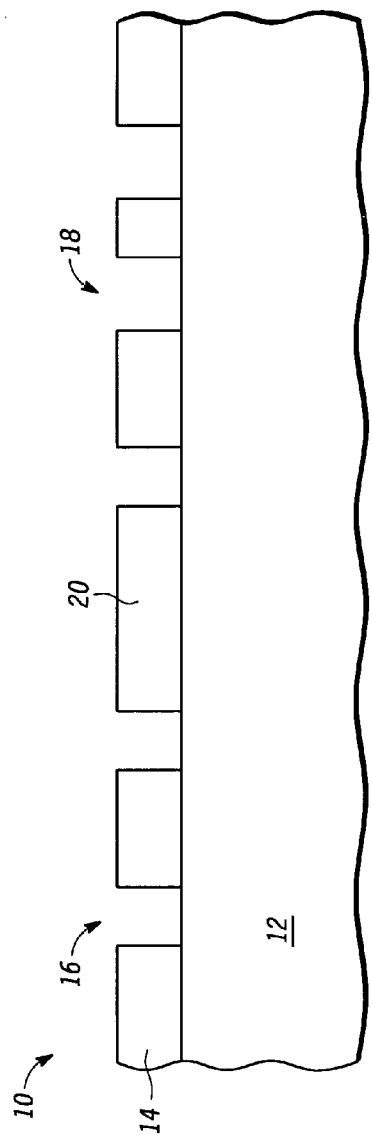
FIG. 1 is a partial side view of an embodiment of an integrated circuit during a processing stage.

FIG. 1 is a partial side view of an embodiment of an integrated circuit during a processing stage. Integrated circuit 10 may include a substrate 12. Using a mask 14 various circuit blocks may be formed in substrate 12. Circuit blocks may be formed in different regions, such as 16, and 18. Although FIG. 1 shows only one mask layer, additional mask layers may be used as part of the formation of various circuit blocks in substrate 12. Using a part 20 of mask 14 a region of substrate 12 may be processed such that it does not receive any dopants.

Figure 2:
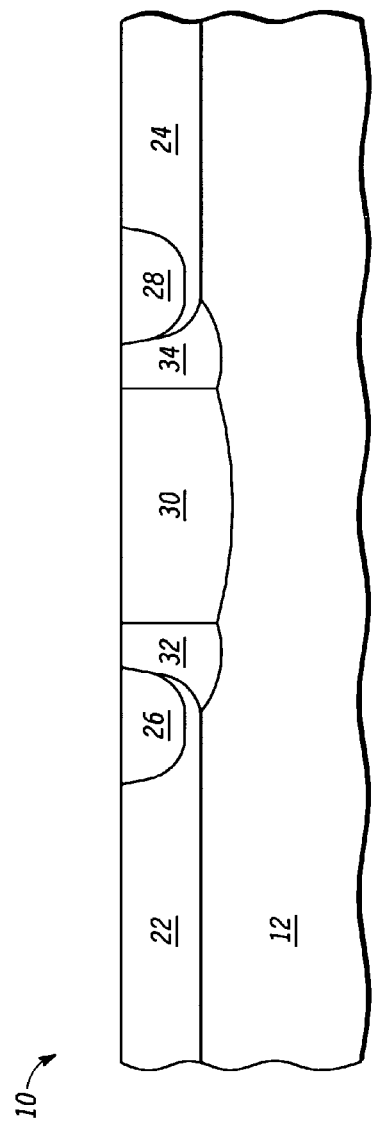
FIG. 2 is a partial side view of an embodiment of an integrated circuit during a processing stage.

Referring now to FIG. 2, a first circuit block 22 and a second circuit block 24 may be formed in substrate 12 using various patterning and implanting steps (not shown). A p-well block region 30 may be formed under part 20 of mask 14, for example. P-well block region 30 may provide noise isolation between first circuit block 22 and second circuit block 24. P-well block region 30 may have a high resistivity due to a low doping concentration. By way of example, p-well block region 30 may have a low doping concentration because insertion of any dopants may be blocked into this region. Alternatively, the doping concentration of p-well block region 30 may be lowered by counter-doping, for example. Guard regions 32 and 34 may be formed surrounding p-well block region 30 for providing additional noise isolation between first circuit block 22 and second circuit block 24. By way of example, guard regions 32 and 34 may represent areas surrounding p-well block region 30 with an intermediate amount of doping compared to the low-doped p-well block region 30. Guard regions 32 and 34, however, may not be as highly doped as the p+ doped regions 26, 28, for example. By way of example, guard regions 32 and 34 may have the same depth as the depth of the p-well block region 30. To provide additional noise isolation a first highly doped region 26 may be formed between guard region 32 and first circuit block 22. A second highly doped region 28 may be formed between guard region 34 and second circuit block 24. First highly doped region 26 and second highly doped region 28 may be grounded. By way of example, first highly doped region 26 and second highly doped region 28 may be doped using a p-type dopant, such as boron or indium, to achieve a p+ type of doping.

Figure 3:
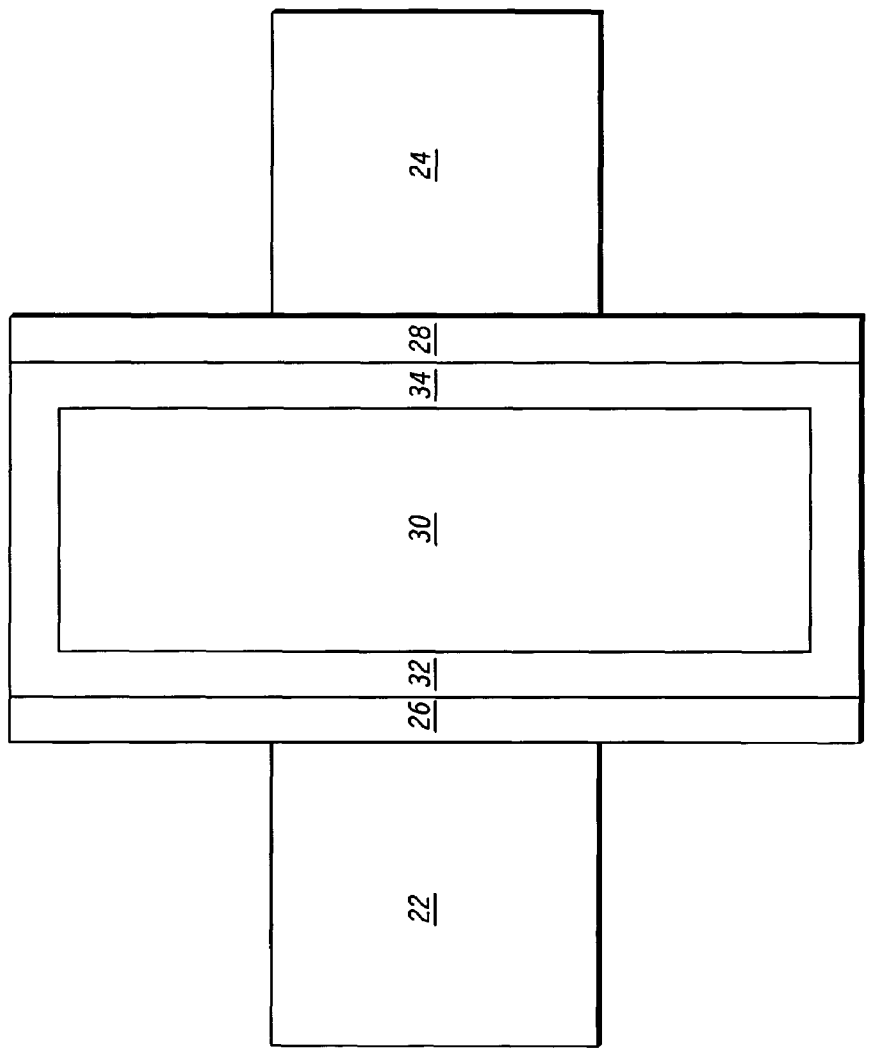
FIG. 3 is a partial side view of an embodiment of an integrated circuit during a processing stage.

FIG. 3, consistent with an embodiment, shows a top view of a p-well block region 30 formed as a wall between first circuit block 22 and second circuit block 24. Guard regions 32 and 34 may be formed as a ring surrounding the wall shaped p-well block region. First highly doped region 26 may be formed between guard region 32 and first circuit block 22. Second highly doped region 28 may be formed between guard region 34 and second circuit block 24.

Figure 4:
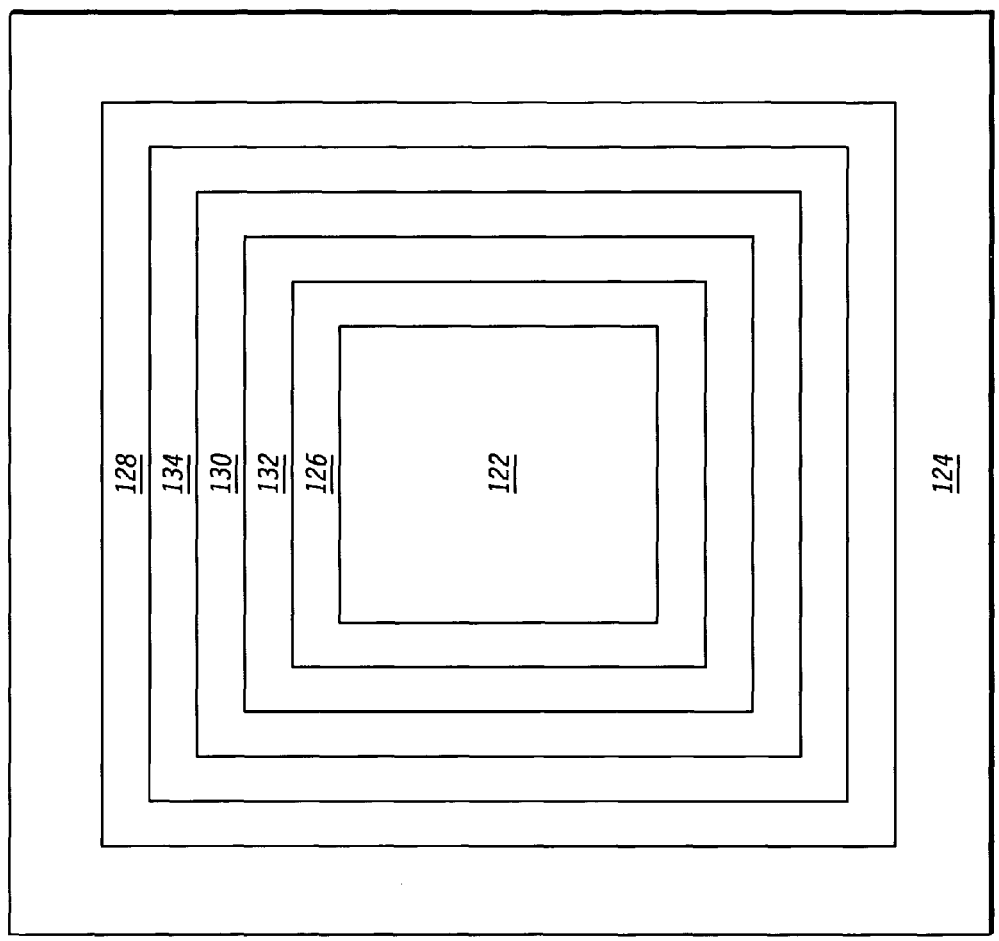
FIG. 4 is a partial side view of an embodiment of an integrated circuit during a processing stage.

FIG. 4, consistent with another embodiment, shows a top view of a p-well region formed 130 as ring formed between first circuit block 122 and second circuit block 124. Guard regions 132 and 134 may be formed as rings surrounding the ring shaped p-well block region 130. First highly doped region 126 may be formed between guard region 132 and first circuit block 122. Second highly doped region 128 may be formed between guard region 134 and second circuit block 124. Although FIGS. 3 and 4 show only two exemplary circuit blocks, integrated circuit 10 may include additional circuit blocks with additional noise isolation structures.

Referring now to FIG. 5, FIG. 5 shows an integrated circuit 100 comprising the same elements as of FIG. 2, and further including a dielectric layer 35 formed over at least p-well block region 30 and guard regions 32 and 34. In addition, by way of example, a conductive shield 36 may be formed over dielectric layer 35. Conductive shield 36 may be grounded to provide additional noise isolation between first circuit block 22 and second circuit block 24. Although FIG. 5 shows only one dielectric layer between conductive shield 36 and p-well block region 30, additional layers may be formed between conductive shield 36 and p-well block region 30. Further, an interconnect (not shown) connecting first circuit block 22 to second circuit block 24 may be formed at a greater distance from a top surface of substrate 12 in a region directly above p-well block region 30 than other regions above substrate 12. Additionally, conductive shield 36 may be positioned such that an area occupied by conductive shield 36 over first circuit block 22 is different from an area occupied by the conductive shield 36 over second circuit block 24. This may be achieved for example, by altering one or both of length and width of conductive shield 36. Additionally and/or alternatively, at least one interconnect may be positioned such that an area occupied by the at least one interconnect over first circuit block 22 is different from an area occupied by the at least one interconnect over second circuit block 24. This may be achieved for example, by altering one or both of the length and the width of the at least one interconnect.

Referring now to FIG. 6, FIG. 6 shows an integrated device 110 having trenches 40 and 42, in addition to the elements of integrated circuit 10 of FIG. 2. Trenches 40 and 42 may provide additional noise isolation between first circuit block 22 and second circuit block 24. Although FIG. 6 shows trenches 40 and 42 extending beyond guard regions 32 and 34, trenches 40 and 42 may be only as deep as guard regions 32 and 34, respectively.

Figure 7:
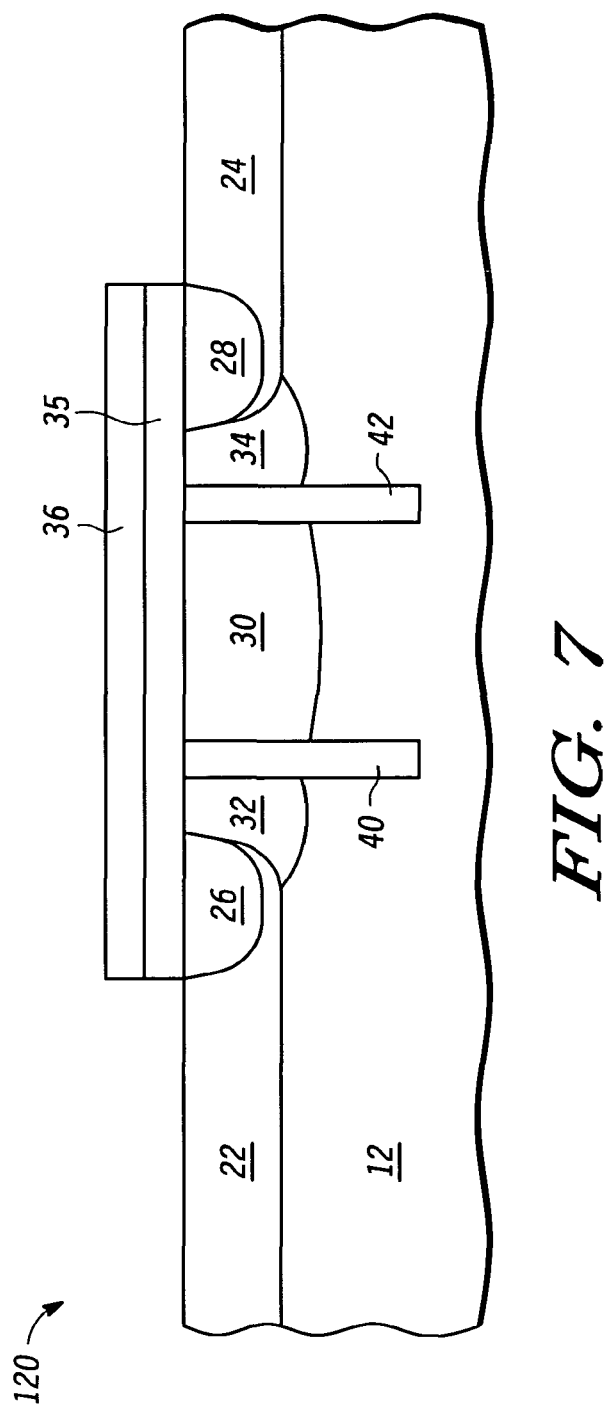
FIG. 7 is a partial side view of an embodiment of an integrated circuit during a processing stage.

FIG. 7 shows an integrated device 120 having a dielectric layer 35 and a conductive shield 36, in addition to elements of integrated circuit 110 of FIG. 6. Conductive shield 36 may be grounded to provide additional noise isolation between first circuit block 22 and second circuit block 24. Although FIG. 5 shows only one dielectric layer between conductive shield 36 and p-well block region 30, additional layers may be formed between conductive shield 36 and p-well block region 30. Further, an interconnect (not shown) connecting first circuit block 22 to second circuit block 24 may be formed at a greater distance from a top surface of substrate 12 in a region directly above p-well block region 30 than other regions above substrate 12. Additionally, conductive shield 36 may be positioned such that an area occupied by conductive shield 36 over first circuit block 22 is different from an area occupied by the conductive shield 36 over second circuit block 24. This may be achieved for example, by altering one or both of length and width of conductive shield 36. Additionally and/or alternatively, at least one interconnect may be positioned such that an area occupied by the at least one interconnect over first circuit block 22 is different from an area occupied by the at least one interconnect over second circuit block 24. This may be achieved for example, by altering one or both of the length and the width of the at least one interconnect.

In the foregoing specification, specific embodiments have been described. However, one of ordinary skill in the art appreciates that various modifications and changes can be made without departing from the scope of the inventive subject matter as set forth in the claims below. For example, although the p-well block region has been described as placed between two circuit blocks to provide noise isolation between the two circuit blocks, p-well block region may also be placed between ESD pads or digital pads. Accordingly, the specification and figures are to be regarded in an illustrative rather than a restrictive sense, and all such modifications are intended to be included within the scope of the inventive subject matter.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:
    a substrate;
    a first circuit block formed in the substrate;
    a second circuit block formed in the substrate;
    a plurality of noise isolation regions formed between the first circuit block and the second circuit block, the plurality of noise isolation regions comprising:
        a p-well block region formed in the substrate and having a first doping concentration of a p-type dopant, the p-well block region at least partially positioned between the first circuit block and the second circuit block, the p-well block region not including any active region therein;
        a first guard region formed in the substrate between the p-well block region and the first circuit block, the first guard region having a second doping concentration of a p-type dopant; and
        a first grounded highly doped region formed in the substrate between the first guard region and the first circuit block, the first grounded highly doped region having a third doping concentration of a p-type dopant; and a first trench formed in the substrate between the p-well block region and the first guard region; and wherein the second doping concentration is higher than the first doping concentration, and wherein the third doping concentration is higher than the second doping concentration.

2. The integrated circuit of claim 1, wherein the first trench has a depth greater than that of the p-well block region and the first guard region.

3. The integrated circuit of claim 1, further comprising:
a second guard region formed in the substrate between the p-well block region and the second circuit block, the second guard region having the second doping concentration.

4. The integrated circuit of claim 3, further comprising:
a second grounded highly doped region formed in the substrate between the second guard region and the second circuit block, the second grounded highly doped region having the third doping concentration.

5. The integrated circuit of claim 3, further comprising a second trench formed between the p-well block region and the second guard region.

6. The integrated circuit of claim 5, wherein the second trench has a depth greater than that of the p-well block region and the second guard region.

7. The integrated circuit of claim 3, wherein the first guard region and the second guard region surround the p-well block region.

8. The integrated circuit of claim 3, wherein the first guard region and the second guard region each have a depth substantially equivalent to the depth of the p-well block region.

9. The integrated circuit of claim 1, further comprising a dielectric layer formed over the p-well block region, the trench, the first guard region, and the first grounded highly doped region.

10. The integrated circuit of claim 9, further comprising a conductive shield formed over the dielectric layer.

11. The integrated circuit of claim 10, wherein the conductive shield is grounded and configured to provide additional noise isolation between the first circuit block and the second circuit block.

12. An integrated circuit, comprising:
a substrate;
a first circuit block formed in the substrate;
a second circuit block formed in the substrate;
a plurality of noise isolation regions formed between the first circuit block and the second circuit block, the plurality of noise isolation regions comprising:
a p-well block region formed in the substrate by blocking insertion of dopants in a region of the substrate between the first circuit block and the second circuit block;
at least one guard region surrounding the p-well block region;
a first grounded highly doped region formed between p-well block region and the first circuit block; and a second grounded highly doped region formed between the p-well block region and the second circuit block;
a dielectric layer formed at least over the p-well block region; and
a grounded conductive shield formed over the dielectric layer.

13. The integrated circuit of claim 12 further comprising at least one trench formed in the substrate and bordering the guard region.

14. The integrated circuit of claim 13, wherein the at least one trench has a depth greater than the at least one guard region.

15. The integrated circuit of claim 12, wherein the p-well block region comprises a wall formed between the first circuit block and the second circuit block.

16. The integrated circuit of claim 12, wherein the dielectric layer extends over the p-well block region, the at least one guard region, the first grounded highly doped region, and the second grounded highly doped region.

17. An integrated circuit, comprising:
a substrate;
a first circuit block formed in the substrate;
a second circuit block formed in the substrate;
a plurality of noise isolation regions formed between the first circuit block and the second circuit block, the plurality of noise isolation regions comprising:
a p-well block region formed in the substrate;
a first guard region formed between the p-well block and the first circuit block;
a second guard region formed between the p-well block and the second circuit block;
a first grounded highly doped region formed between the first guard region and the first circuit block; and
a second grounded highly doped region formed between the second guard region and the second circuit block;
a first trench formed in the substrate between the p-well block region and the first grounded highly dope region;
a second trench formed in the substrate between the p-well block region and the second grounded highly dope region;
a dielectric layer formed at least over the p-well block region, the first trench, and the second trench; and
a grounded conductive shield formed over the dielectric layer.

18. The integrated circuit of claim 17, wherein the first and second guard regions are integrally formed as a ring surrounding the p-well block region.

19. The integrated circuit of claim 17, wherein the p-well block region does not including any active regions therein.

20. The integrated circuit of claim 19, wherein the p-well block region has a first doping concentration of a p-type dopant, wherein the first guard region has a second doping concentration of a p-type dopant greater than the first doping concentration, and wherein first grounded highly doped region has a third doping concentration of a p-type dopant greater than the second doping concentration.

* * * * *